United States Patent
Liu et al.

(10) Patent No.: US 12,406,177 B2
(45) Date of Patent: Sep. 2, 2025

(54) AFFERENT NEURON CIRCUIT AND MECHANORECEPTIVE SYSTEM

(71) Applicant: INSTITUTE OF MICROELECTRONICS OF THE CHINESE ACADEMY OF SCIENCES, Beijing (CN)

(72) Inventors: Qi Liu, Beijing (CN); Xumeng Zhang, Beijing (CN); Ming Liu, Beijing (CN); Hangbing Lv, Beijing (CN); Zuheng Wu, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 894 days.

(21) Appl. No.: 17/597,798

(22) PCT Filed: Nov. 29, 2019

(86) PCT No.: PCT/CN2019/121843
§ 371 (c)(1),
(2) Date: Jan. 24, 2022

(87) PCT Pub. No.: WO2021/097899
PCT Pub. Date: May 27, 2021

(65) Prior Publication Data
US 2022/0253684 A1 Aug. 11, 2022

(30) Foreign Application Priority Data
Nov. 18, 2019 (CN) .......................... 201911127991.9

(51) Int. Cl.
*G06N 3/063* (2023.01)
*H10N 39/00* (2023.01)

(52) U.S. Cl.
CPC ............. *G06N 3/063* (2013.01); *H10N 39/00* (2023.02)

(58) Field of Classification Search
CPC ........ G06N 3/049; G06N 3/063; H10N 39/00; H10N 70/841; H10N 30/87; H10N 30/877;
(Continued)

(56) References Cited

U.S. PATENT DOCUMENTS

| | | | | |
|---|---|---|---|---|
| 2012/0249252 A1* | 10/2012 | Borghetti | ................. | H03B 7/00 331/132 |
| 2014/0035614 A1* | 2/2014 | Pickett | ................... | G06N 3/065 326/30 |
| 2020/0194667 A1* | 6/2020 | Park | ...................... | H10B 63/22 |

OTHER PUBLICATIONS

Wicker, Guy et al. "Potential application of time dependent threshold switching in neuromorphic computing" 2017 17th Non-Volatile Memory Technology Symposium (NVMTS), published by IEEE, Dec. 11, 2017 (Dec. 11, 2017), Aachen, Germany. (Year: 2017).*

* cited by examiner

Primary Examiner — Didarul A Mazumder
(74) Attorney, Agent, or Firm — Platinum Intellectual Property

(57) ABSTRACT

Disclosed is an afferent neuron circuit, which includes: a resistance Rc and a volatile threshold switching device TS, wherein the volatile threshold switching device TS is provided with a parasitic capacitor Cparasitic; a first end of the resistance Rc serves as a signal input terminal, and a second end of the resistance Rc serves as a signal output terminal; and a first end of the volatile threshold switching device TS is connected to the signal output terminal, and a second end of the volatile threshold switching device TS is grounded. The afferent neuron circuit provided in the content of the
(Continued)

present disclosure has a simple structure and good scalability and is suitable for large-scale integration.

8 Claims, 7 Drawing Sheets

(58) Field of Classification Search
CPC ... H10N 70/881; H10N 70/883; H10N 30/704
USPC ......... 257/499; 438/218, 219, 294, 353, 400
See application file for complete search history.

AFFERENT NEURON CIRCUIT AND MECHANORECEPTIVE SYSTEM

CROSS-REFERENCE TO RELATED APPLICATIONS

This application claims the priority of Chinese Patent Application No. 201911127991.9 filed before the Chinese National Intellectual Property Administration on Nov. 18, 2019, the entire content of which is incorporated herein by reference.

TECHNICAL FIELD

The present disclosure relates to an afferent neuron circuit and a mechanoreceptive system, which belong to the technical field of brain-like bionics.

BACKGROUND OF THE INVENTION

The present disclosure provides an afferent neuron circuit and a mechanoreceptive system. An artificial afferent neuron is a component that converts an external stimulation signal into a systematic impulse signal and plays an important role in the construction of an impulse neural network system. At present, an afferent neuron circuit is mainly based on CMOS circuits, so that it has a complex structure and poor scalability and thereby is not applicable to large-scale integration use.

SUMMARY OF THE INVENTION

The present disclosure provides an afferent neuron circuit and a mechanoreceptive system, which solves the technical problem in the existing technology that afferent neuron circuits have a complex structure and poor scalability and thereby are not applicable to large-scale integration use.

In one aspect of the present disclosure, provided is an afferent neuron circuit, which includes a resistance Rc and a volatile threshold switching device TS, wherein the volatile threshold switching device TS has a parasitic capacitor Cparasitic; a first end of the resistance Rc is used as a signal input terminal, and a second end of the resistance Rc is used as a signal output terminal; a first end of the volatile threshold switching device TS is connected to the signal output terminal, and a second end of the volatile threshold switching device TS is grounded.

In some embodiments, the afferent neuron circuit adopts an integrated semiconductor structure.

In some embodiments, the volatile threshold switching device TS includes: a first substrate 11; a first isolation layer 12 formed on the first substrate 11; a first lower electrode 13 formed on the first isolation layer 12; a second isolation layer 14 formed on the first lower electrode 13; a first functional layer 15 formed on the second isolation layer 14, wherein a middle part of the first functional layer 15 is connected to the first lower electrode 13 through an etched via hole; and a first intermediate electrode 16 formed on the first functional layer 15, wherein a first resistive film 17 is deposited on the first intermediate electrode 16 to serve as the resistance Rc, and a first upper electrode 18 is deposited on the first resistive film 17.

In some embodiments, the first substrate 11 is a silicon wafer; the first isolation layer 12 is a $SiO_2$ layer; a material of the first lower electrode 13 is TiN, Poly-Si, Pd, Pt, W, or Au; the second isolation layer 14 is a $SiO_2$ layer; a material of the first functional layer 15 is $NbO_2$, $VO_2$, SiTe, $SiO_2$:Ag, a-Si:Cu, a-Si:Ag, or $AM_4Q_8$; a material of the first intermediate electrode 16 is TiN, Poly-Si, Pd, Pt, W, Cu, Ag or Au; a resistance value of the first resistive film 17 is greater than 5 times of a resistance value of the first functional layer 15 in a low-resistance state and is less than ⅕ of a resistance value of the first functional layer 15 in a high-resistance state; wherein the $AM_4Q_8$ is a mixed material of Ga, Ge, V, Nb, Ta, Mo, S, and Se.

In some embodiments, the volatile threshold switching device TS includes: a second substrate 21; a third isolation layer 22 formed on the second substrate 21; a second lower electrode 23 formed on the third isolation layer 22; a second functional layer 24 formed on the third isolation layer 23; and a second intermediate electrode 25 formed on the second functional layer 24, wherein a second resistive film 26 is deposited on the second intermediate electrode 25 to serve as the resistance Rc, and a second upper electrode 27 is deposited on the second resistive film 26.

In some embodiments, the second substrate 21 is a silicon wafer; the third isolation layer 22 is a $SiO_2$ layer; a material of the second lower electrode 23 is TiN, Poly-Si, Pd, Pt, W or Au; a material of the second functional layer 24 is $NbO_2$, $VO_2$, SiTe, $SiO_2$:Ag, a-Si:Cu, a-Si:Ag, or $AM_4Q_8$; a material of the second intermediate electrode 25 is TiN, Poly-Si, Pd, Pt, W, Cu, Ag, or Au; a resistance value of the second resistive film 26 is greater than 5 times of a resistance value of the second functional layer 24 in a low-resistance state and is less than ⅕ of a resistance value of the first functional layer 15 in a high-resistance state; and wherein said the $AM_4Q_8$ is a mixed material of Ga, Ge, V, Nb, Ta, Mo, S, and Se.

In another aspect of the present disclosure, provided is a mechanoreceptive system, which includes: the aforementioned afferent neuron circuit; and, a first piezoelectric film 19 formed on the first upper electrode 18 of the aforementioned afferent neuron circuit, and a first ground electrode 10 deposited on the first piezoelectric film 19.

In some embodiments, a material of the first piezoelectric film 19 may be $BaTiO_3$/bacterial cellulose, $K_{0.5}Na_{0.5}NbO_3$—$BaTiO_3$/polyvinylidene fluoride, crystal, lithium gallate, lithium germanate, titanium germanate, or lithium tantalate.

In yet another aspect of the present disclosure, provided is a mechanoreceptive system, which includes: the aforementioned afferent neuron circuit; and, a second piezoelectric film 28 formed on the second upper electrode 27 of the aforementioned afferent neuron circuit, and a second ground electrode 29 deposited on the second piezoelectric film 28.

In some embodiments, a material of the second piezoelectric film 28 may be $BaTiO_3$/bacterial cellulose, $K_{0.5}Na_{0.5}NbO_3$—$BaTiO_3$/polyvinylidene fluoride, crystal, lithium gallate, lithium germanate, titanium germanate, or lithium tantalate.

The present disclosure provides an afferent neuron circuit and a mechanoreceptive system, wherein the afferent neuron circuit with a simple structure is formed by connecting a resistance Rc and a volatile threshold switching device TS in series. A connection point between the volatile threshold switching device TS and the resistance Rc is used as a signal output terminal. An input signal is a voltage signal or a current signal, and an output signal is an oscillation frequency signal. An oscillation frequency of the output signal is related to the strength of the input signal. The volatile threshold switching device TS is provided with a parasitic capacitor $C_{parasitic}$, so that when there is an input signal at the signal input terminal, the TS device is charged by the circuit through the resistance Rc; when a voltage across the parasitic capacitor $C_{parasitic}$ exceeds a switching voltage of the TS device, the TS device switches to a low-resistance state, and the capacitor discharges through the TS device; when the voltage across the parasitic capacitor Cparasitic drops to a holding voltage of the TS device, the TS device switches to a high-resistance state, and the parasitic capacitor Cparasitic is charged again through the resistance Rc. These are repeated over and over again to form an oscillation output pulse signal, thereby achieving the so-called functional integrity of an afferent neuron.

BRIEF DESCRIPTION OF THE DRAWINGS

By reading the detailed description of the preferred embodiments below, various other advantages and benefits will become clear to those of ordinary skill in the art. The drawings are only used for the purpose of illustrating the preferred embodiments and should not be considered as a limitation to the present disclosure. Also, throughout the drawings, the same reference symbol is configured to denote the same component.

DETAILED DESCRIPTION OF THE INVENTION

Hereinafter, exemplary embodiments of the present disclosure will be described in more detail with reference to the accompanying drawings. Although the drawings show exemplary embodiments of the present disclosure, it should be understood that the present disclosure can be implemented in various forms and should not be limited by the embodiments set forth herein. Rather, these embodiments are provided to enable a more thorough understanding of the present disclosure and to fully convey the scope of the present disclosure to those skilled in the art.

The technical solution of the present disclosure will be further described in detail below through the accompanying drawings and specific embodiments.

Embodiment 1 of the Present Disclosure

Figure 1:
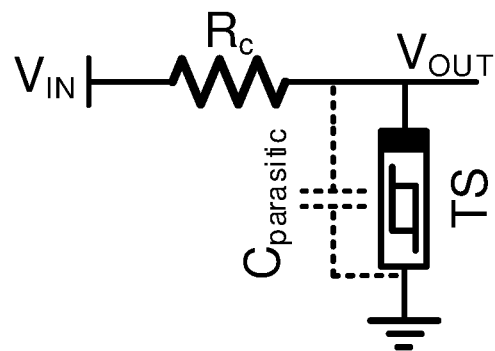
FIG. 1 is a schematic principle diagram of an afferent neuron circuit provided by the Embodiment 1 of the disclosure.

Referring to FIG. 1, the present embodiment provides an afferent neuron circuit, including a resistance Rc and a volatile threshold switching device TS. The volatile threshold switching device TS is provided with a parasitic capacitor Cparasitic. A first end of the resistance Rc serves as a signal input terminal, and a second end of the resistance Rc serves as a signal output terminal. A first end of the volatile threshold switching device TS is connected to the signal output terminal, and a second end of the volatile threshold switching device TS is grounded.

An input signal is a voltage signal or a current signal, and an output signal is an oscillation frequency signal. An oscillation frequency of the output signal is related to the strength of the input signal.

When there is an input signal at the signal input terminal, the parasitic capacitor Cparasitic is charged by the circuit through the resistance Rc.

In the case that a voltage across the parasitic capacitor Cparasitic exceeds a switching voltage of the volatile threshold switching device TS, the volatile threshold switching device TS switches to a low-resistance state, and the parasitic capacitor Cparasitic discharges through the volatile threshold switching device TS.

In the case that the voltage across the parasitic capacitor Cparasitic drops to a holding voltage of the volatile threshold switching device TS, the volatile threshold switching device TS switches to a high-resistance state, and the parasitic capacitor Cparasitic is charged again through the resistance Rc. The charge and discharge processes are repeated over and over again to form an oscillation output pulse signal.

Figure 2:
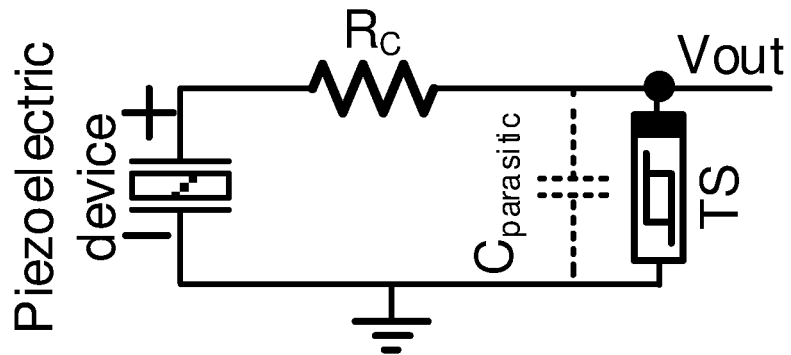
FIG. 2 is a schematic principle diagram of a mechanoreceptive system provided by the Embodiment 1 of the disclosure.

Referring to FIG. 2, on the basis of the afferent neuron circuit, a piezoelectric component is attached so as to form a mechanoreceptive system. In this case, the piezoelectric component is configured to convert a sensed mechanical stimulus into a related voltage signal. In a resting state, the piezoelectric component has no output; that is, its static power consumption is zero. The mechanoreceptive system converts a voltage signal generated by the piezoelectric component into a relevant oscillation frequency output signal during operation. An oscillation frequency of the output signal is related to a mechanical strength sensed by the piezoelectric component.

Figure 3:
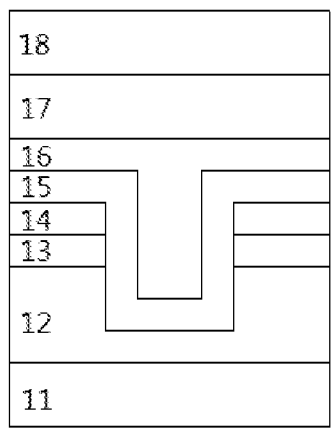
FIG. 3 is a schematic diagram of an integrated semiconductor structure of the afferent neuron circuit provided by the Embodiment 1 of the disclosure.

Referring to FIG. 3, in this embodiment, the afferent neuron circuit uses an integrated semiconductor structure in order to improve structural scalability and facilitate integration use of the afferent neuron circuit.

Specifically, the volatile threshold switching device TS includes:
- a first substrate 11;
- a first isolation layer 12, which is formed on the first substrate 11;
- a first lower electrode 13, which is formed on the first isolation layer 12;
- a second isolation layer 14, which is formed on the first lower electrode 13;
- a first functional layer 15, which is formed on the second isolation layer 14, wherein a middle part of the first functional layer 15 is connected to the first lower electrode 13 through an etched via hole; and
- a first intermediate electrode 16, which is formed on the first functional layer 15;
- wherein a first resistive film 17 is deposited on the first intermediate electrode 16 to serve as the resistance Rc, and a first upper electrode 18 is deposited on the first resistive film 17.

In the present embodiment, the first substrate 11 is a silicon wafer;
- the first isolation layer 12 is a $SiO_2$ layer;
- the material of the first lower electrode 13 is TiN, Poly-Si, Pd, Pt, W, or Au, and may also be selected from other inert conductive materials;
- the second isolation layer 14 is a $SiO_2$ layer;
- the material of the first functional layer 15 is $NbO_2$, $VO_2$, SiTe, $SiO_2$:Ag, a-Si:Cu, a-Si:Ag or $AM_4Q_8$; the material of the functional layer may, but be not limited to, be selected from the above materials, and any material having a volatile threshold switching characteristic can be used;
- the material of the first intermediate electrode 16 is TiN, Poly-Si, Pd, Pt, W, Cu, Ag or Au;
- the resistance value of the first resistive film 17 is greater than 5 times of a resistance value of the first functional layer 15 in a low-resistance state and is less than ⅕ of a resistance value of the first functional layer 15 in a high-resistance state; and
- in this case, the $AM_4Q_8$ is a mixed material of Ga, Ge, V, Nb, Ta, Mo, S, and Se.

Figure 4:
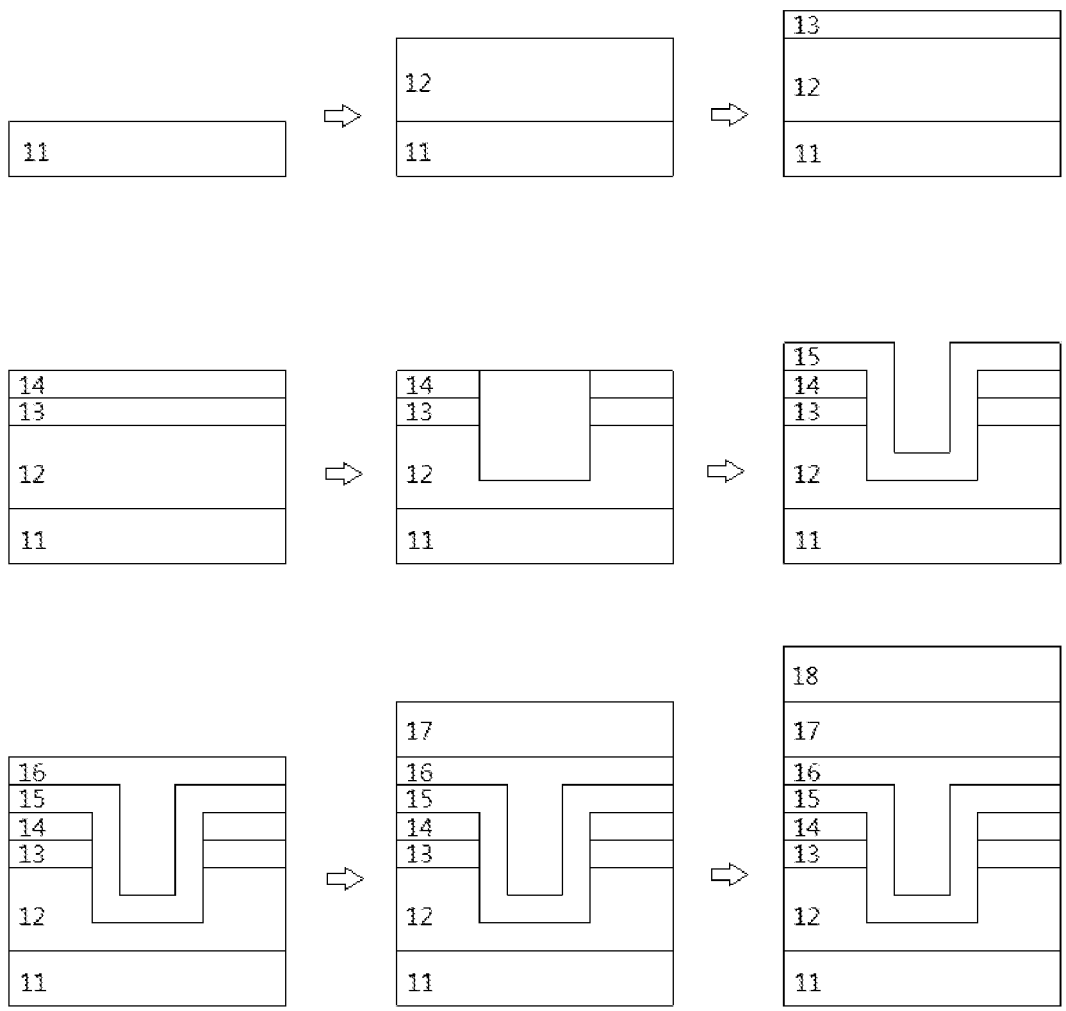
FIG. 4 is a schematic diagram of processing flow of the integrated semiconductor structure of the afferent neuron circuit provided by the Embodiment 1 of the disclosure.

Referring to FIG. 4, a process for preparing an afferent neuron circuit and a mechanoreceptive system will be described in detail below.

At Step 1, a silicon wafer serves as a first substrate 11, and oxidation is applied on the silicon wafer to form a $SiO_2$ layer as a first isolation layer 12. The thickness of the $SiO_2$ layer is 100 nm~300 nm, and the thickness of the $SiO_2$ layer may also be decreased or increased according to an actual process condition.

At Step 2, a first lower electrode 13 is deposited on the $SiO_2$ layer. The thickness of the first lower electrode 13 is 10 nm~100 nm.

At Step 3, a second isolation layer 14 is deposited on the first lower electrode 13. The second isolation layer 14 is a $SiO_2$ layer with a thickness of 100 nm to 300 nm. The thickness of the $SiO_2$ layer may also be decreased or increased according to an actual process condition.

At Step 4, by using an etching process, a hole is etched on the deposited films prepared in Steps 1 to 3. The depth of the hole directly reaches inside of the first isolation layer 12, and the first isolation layer 12 is etched by a certain depth to ensure that the cross-section of the first lower electrode 13 is completely exposed. The first isolation layer 12 should also retain a sufficient thickness after etching.

At Step 5, a first functional layer 15 is deposited on the etched hole. The thickness of the first functional layer 15 is 5 nm~50 nm.

At Step 6, a first intermediate electrode 16 is deposited on the first functional layer 15. The thickness of the first intermediate electrode 16 is 10 nm~100 nm.

At Step 7, a first resistive film 17 is deposited on the first intermediate electrode 16 to serve as a resistance Rc. The resistance value of the first resistive film 17 is 1 Ω~1 MΩ, which depends on a high-resistance or low-resistance state of the functional layer that is actually deposited.

At Step 8, a first upper electrode 18 is deposited on the first resistive film. A material of the first upper electrode 18 is not limited herein.

Figure 5:
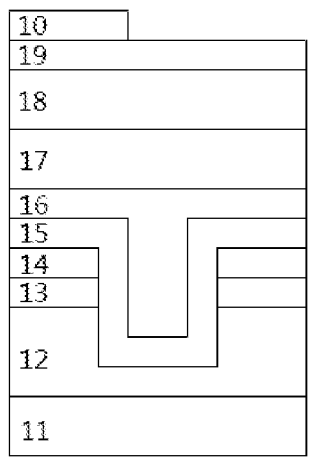
FIG. 5 is a schematic diagram of an integrated semiconductor structure of the mechanoreceptive system provided by the Embodiment 1 of the disclosure.

Referring to FIG. 5, the present disclosure further provides a mechanoreceptive system, including:
- the afferent neuron circuit;
- a first piezoelectric film 19, which is formed on the first upper electrode 18; and
- a first ground electrode 10, which is deposited on the first piezoelectric film 19.

In some schemes, a material of the first piezoelectric film 19 may be $BaTiO_3$/bacterial cellulose, $K_{0.5}Na_{0.5}NbO_3$—$BaTiO_3$/polyvinylidene fluoride, crystal, lithium gallate, lithium germanate, titanium germanate, or lithium tantalate. The piezoelectric material may, but be not limited to, be selected from the above materials, and any material having a piezoelectric characteristic can be applied. However, the thermal budget of the functional layers should be taken into account during integration so as to determine the annealing temperature of the piezoelectric material.

Figure 6:
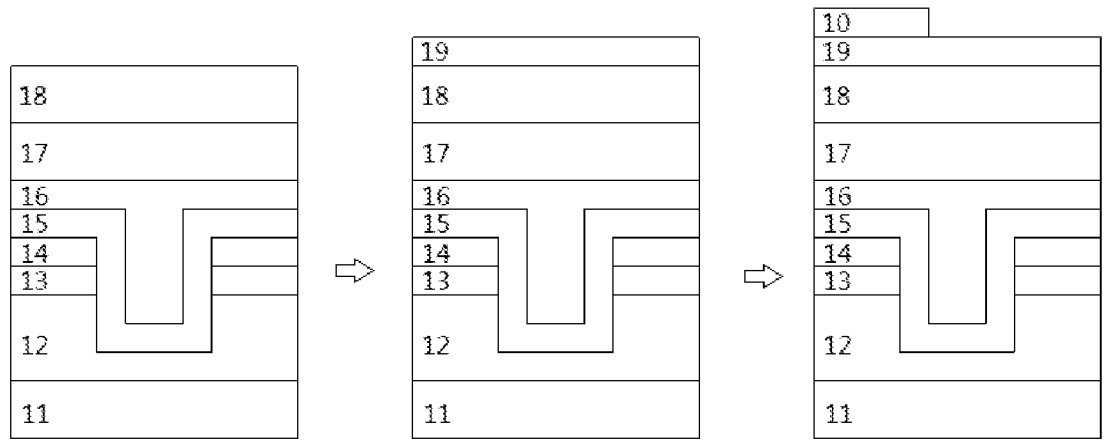
FIG. 6 is a schematic diagram of processing flow of the integrated semiconductor structure of the mechanoreceptive system provided by the Embodiment 1 of the disclosure.

Referring to FIG. 6, a method for preparing a mechanoreceptive system is provided according to the disclosure on the basis of the method mentioned above and includes steps 9 and 10.

At Step 9, on the basis of the aforementioned afferent neuron circuit, a first piezoelectric film 19 is deposited on the first upper electrode 18.

At Step 10, a first ground electrode 10 is deposited on the first piezoelectric film 19. The material of the first ground electrode 10 is not limited herein.

Embodiment 2

Figure 7:
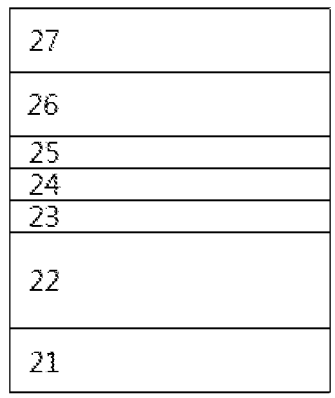
FIG. 7 is a schematic diagram of an integrated semiconductor structure of an afferent neuron circuit provided by the Embodiment 2 of the disclosure.

Referring to FIG. 7, on the basis of the Embodiment 1, another implementation of a volatile threshold switching device TS is provided.

The volatile threshold switching device TS includes:
- a second substrate 21;
- a third isolation layer 22, which is formed on the second substrate 21;
- a second lower electrode 23, which is formed on the third isolation layer 22;
- a second functional layer 24, which is formed on the third isolation layer 23; and
- a second intermediate electrode 25, which is formed on the second functional layer 24;
- wherein a second resistive film 26 is deposited on the second intermediate electrode 25 to serve as the resistance Rc; and a second upper electrode 27 is deposited on the second resistive film 26.

In the present embodiment, the second substrate 21 is a silicon wafer;
- the third isolation layer 22 is a $SiO_2$ layer;
- the material of the second lower electrode 23 is an inert conductive material, such as TiN, Poly-Si, Pd, Pt, W, or Au;

the material of the second functional layer 24 is $NbO_2$, $VO_2$, SiTe, $SiO_2$:Ag, a-Si:Cu, a-Si:Ag or $AM_4Q_8$; the material of the functional layer may, but be not limited to, be selected from the above materials, and any material having a volatile threshold switching characteristic can be used;

the material of the second intermediate electrode 25 is a conductive material, such as TiN, Poly-Si, Pd, Pt, W, Cu, Ag, or Au;

the resistance value of the second resistive film 26 is greater than 5 times of a resistance value of the second functional layer 24 in a low-resistance state and is less than 1/5 of a resistance value of the first functional layer 15 in a high-resistance state; and in this case, the $AM_4Q_8$ is a mixed material of Ga, Ge, V, Nb, Ta, Mo, S, and Se.

Figure 8:
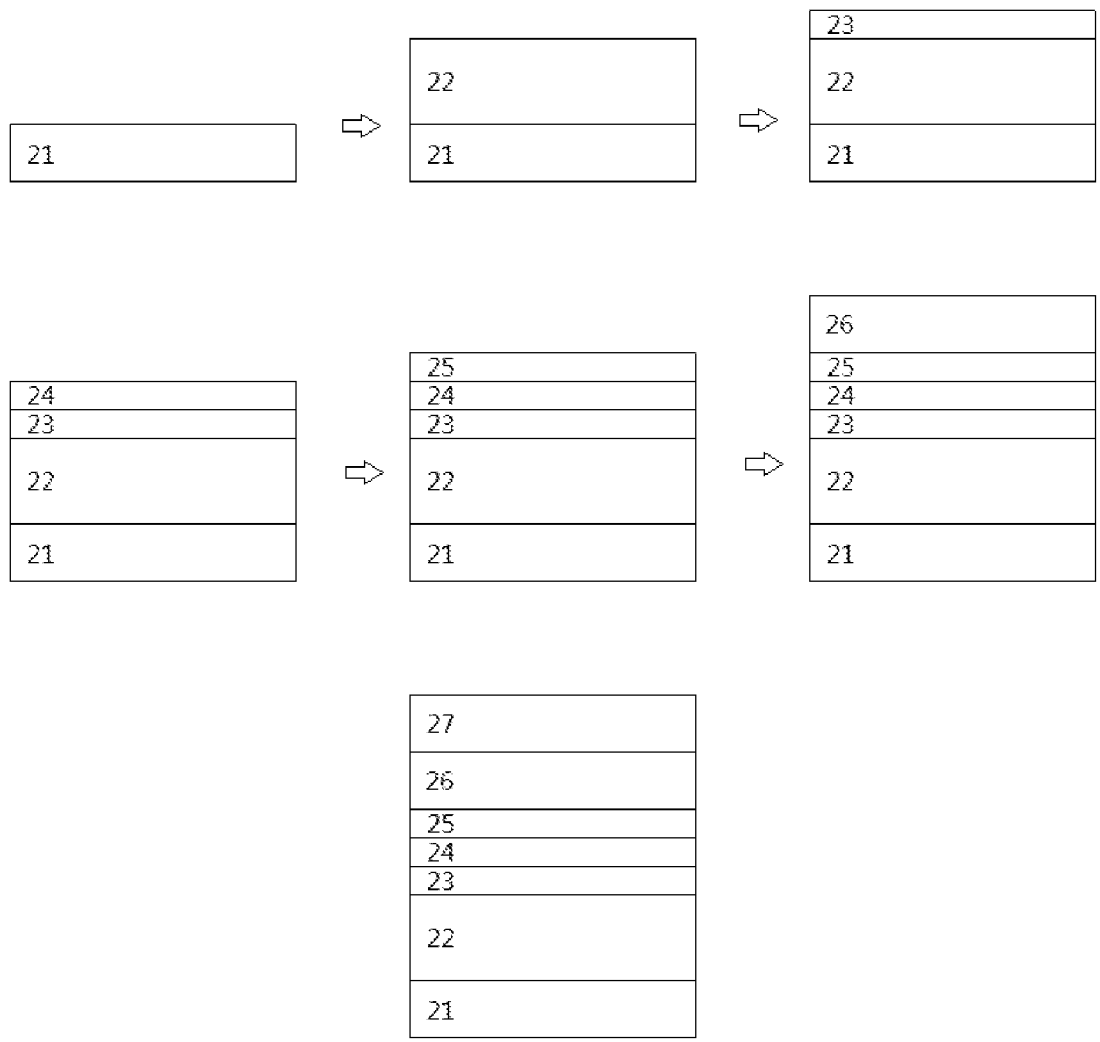
FIG. 8 is a schematic diagram of the processing flow of the integrated semiconductor structure of the afferent neuron circuit provided by the Embodiment 2 of the disclosure.

Referring to FIG. 8, the present disclosure further provides a method for preparing the volatile threshold switching device TS, which may include steps 1-6.

At Step 1, a silicon wafer serves as a second substrate 21, and oxidation is applied on the silicon wafer to form a $SiO_2$ layer as a second isolation layer 22. The thickness of the $SiO_2$ layer is 100 nm~300 nm. The thickness of the $SiO_2$ layer may also be decreased or increased according to an actual process condition.

At Step 2, a second lower electrode 23 is deposited on the second isolation layer 22. The thickness of the second lower electrode 23 is 10 nm~100 nm.

At Step 3, a second functional layer 24 is deposited on the second lower electrode 23. The thickness of the second functional layer 24 is 5 nm~50 nm.

At Step 4, a second intermediate electrode 25 is deposited on the second functional layer 24. The thickness of the second intermediate electrode 25 is 10 nm~100 nm.

At Step 5, a second resistive film 26 is deposited on the second intermediate electrode 25. The resistance value of the second resistive film 26 is 1 Ω~1 MΩ, which depends on a high-resistance or low-resistance state of the functional layer that is actually deposited.

At Step 6, a second upper electrode 27 is deposited on the second resistive film 26. The material of the second upper electrode 27 is not limited herein.

Figure 9:
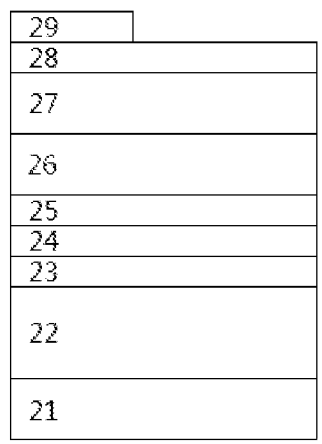
FIG. 9 is a schematic diagram of an integrated semiconductor structure of a mechanoreceptive system provided by the Embodiment 2 of the disclosure.

Referring to FIG. 9, the present disclosure further provides a mechanoreceptive system, including: the aforementioned afferent neuron circuit; a second piezoelectric film 28, which is formed on the second upper electrode 27; and a second ground electrode 29, which is deposited on the second piezoelectric film 28.

The material of the second piezoelectric film 28 may be $BaTiO_3$/bacterial cellulose, $K_{0.5}Na_{0.5}NbO_3$—$BaTiO_3$/polyvinylidene fluoride, crystal, lithium gallate, lithium germanate, titanium germanate, or lithium tantalate.

Figure 10:
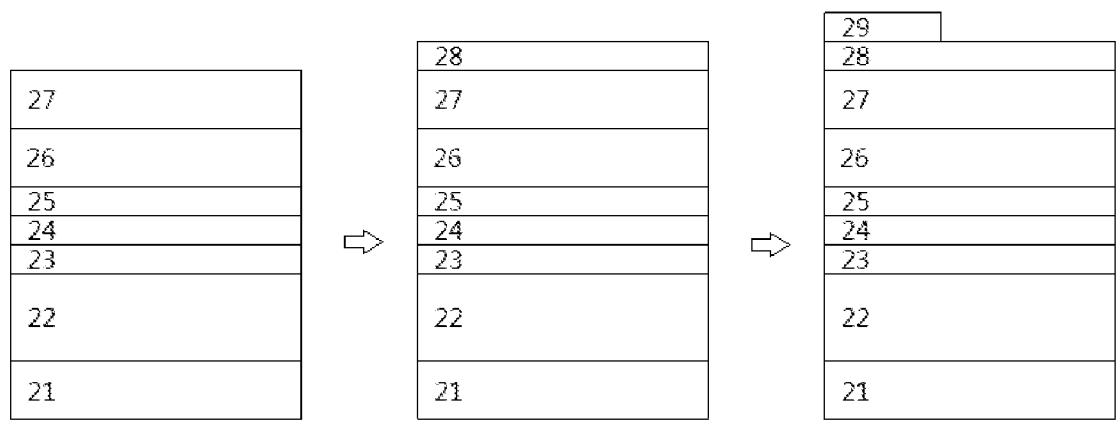
FIG. 10 is a schematic diagram of the processing flow of the integrated semiconductor structure of the mechanoreceptive system provided by the Embodiment 2 of the disclosure.

Referring to FIG. 10, the present disclosure further provides a preparation method, which may include steps 7 and 8.

At Step 7, on the basis of the aforementioned afferent neuron integration scheme, a second piezoelectric film 28 is deposited on the second upper electrode 27. A piezoelectric material may, but be not limited to, be selected from the above materials, and any material having a piezoelectric characteristic can be used. However, a thermal budget of the functional layer should be taken into account during integration so as to determine the annealing temperature of the piezoelectric material.

At Step 8, a second ground electrode 29 is deposited on the second piezoelectric film 28. The material of the second ground electrode 29 is not limited herein.

The performance of the above circuits and systems is described below through graphs.

Figure 11:
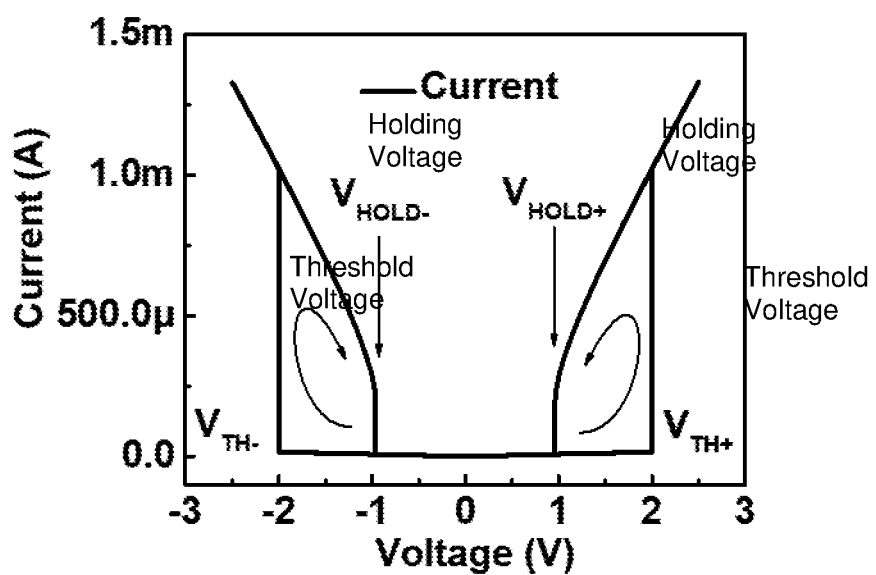
FIG. 11 shows I-V characteristic curves of the afferent neuron circuits provided by the Embodiment 1 and the Embodiment 2 of the disclosure.

Referring to FIG. 11, a simulation graph of I-V characteristic curves is obtained by subjecting the volatile threshold switching devices TS prepared in the Embodiment 1 and Embodiment 2 to voltage scanning;

When a voltage applied to the intermediate electrode exceeds a certain voltage value ($V_{TH+}$ or $V_{TH-}$), the volatile threshold switching device TS switches from a high-resistance state to a low-resistance state.

In the process of voltage flyback, when the voltage is less than a certain voltage value ($V_{HOLD+}$ or $V_{HOLD-}$), the volatile threshold switching device TS returns from the low-resistance state to the high-resistance state as the voltage of the intermediate electrode is not adequate to maintain the low-resistance state of the volatile threshold switching device TS.

Figure 12:
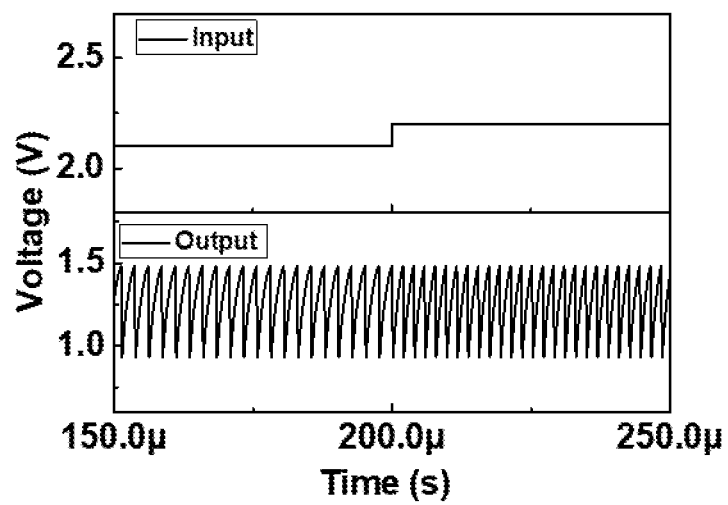
FIG. 12 shows output oscillation curves of the afferent neuron circuits provided by the Embodiment 1 and the Embodiment 2 of the disclosure that are subjected to two input voltages.

Referring to FIG. 12, shown is a simulation graph of output oscillation curves of the afferent neuron circuit subjected to two input voltages. The afferent neuron circuit is subjected to two input voltages to output oscillation curves. When an input is a constant voltage value, the afferent neuron outputs a stable oscillation signal, and the output frequency of the oscillation signal is related to the magnitude of the input voltage. This corresponds to a working mode of afferent neurons in an organism. The result indicates that the designed afferent neuron circuit can convert simulated input signals into different output oscillation frequencies, which can meet a requirement of an impulse neural network.

Figure 13:
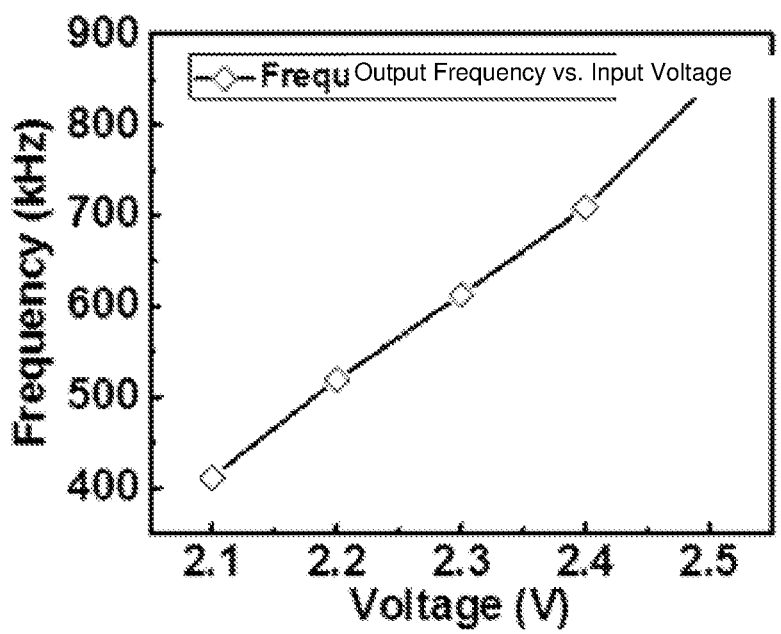
FIG. 13 shows a relationship between an output frequency and an input voltage of the afferent neuron circuits provided by the Embodiment 1 and the Embodiment 2 of the disclosure.

Referring to FIG. 13, shown is a simulation graph of the relationship between an output frequency and an input voltage of the afferent neuron circuits provided by the Embodiment 1 and Embodiment 2. Within a certain voltage range, an output frequency of the afferent neuron presents a linear increase relation relative to an input voltage. This indicates that the output frequency of the afferent neuron circuit can correctly reflect the strength of the stimulus input.

Figure 14:
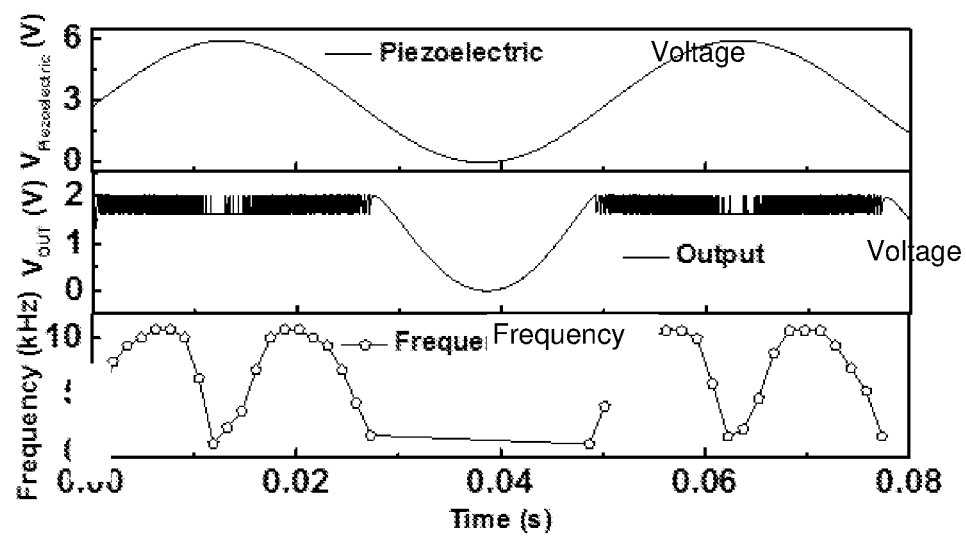
FIG. 14 shows an output voltage curve of a piezoelectric film when pressure is exerted, an oscillation output curve, and an oscillation output frequency curve of the afferent neuron circuits provided by the Embodiment 1 and the Embodiment 2 of the disclosure.

Referring to FIG. 14, shown is a simulation graph showing an output voltage curve of the piezoelectric film when pressure is applied thereon, an oscillation output curve, and an oscillation output frequency curve of the afferent neuron circuits provided by the Embodiment 1 and Embodiment 2. The output frequency of the afferent neuron subjected to a large-amplitude sine wave input has two frequency peaks. Within a small range of the input voltage, the output frequency increases positively with the increase of the input voltage. When the input voltage reaches a certain value, the output frequency reaches the maximum saturation value. Then, the voltage is continually increased so that the output oscillation frequency gradually decreases until oscillation stops. This indicates that the afferent neuron circuit has a self-protection mechanism. That is, when an external stimulation signal is too strong in strength, the afferent neuron circuit can self-adjust the output frequency to adapt to the external environment, thereby maintaining subsequent stability of the system.

It is ready to find that the circuit and system prepared according to the above embodiments all have good performances of an afferent neuron circuit.

According to the embodiments of the present disclosure, one or more technical solutions have at least the following technical effects or advantages.

According to the afferent neuron circuit and the mechanoreceptive system that the embodiments of the present disclosure have provided, an afferent neuron circuit is formed with a simple structure by connecting a resistance Rc and a volatile threshold switching device TS in series. A connection point between the volatile threshold switching device TS and the resistance Rc is used as a signal output terminal. An input signal is a voltage signal or a current signal, and an output signal is an oscillation frequency signal. The oscillation frequency of the output signal is related to the strength of the input signal. The volatile threshold switching device TS is provided with a parasitic capacitor $C_{parasitic}$, so that when there is an input signal at the signal input terminal, the TS device is charged by the circuit through the resistance Rc; when a voltage across the parasitic capacitor Cparasitic exceeds a switching voltage of the TS device, the TS device switches to a low-resistance state, and the capacitor discharges through the TS device; when the voltage across the parasitic capacitor Cparasitic drops to a holding voltage of the TS device, the TS device switches to a high-resistance state, and the parasitic capacitor Cparasitic is charged again through the resistance Rc. These are repeated over and over again to form an oscillation output pulse signal, thereby achieving functional integrity.

The above are only preferred embodiments of the present disclosure and are not used to limit the protection scope of the present disclosure. Any modification, equivalent replacement, and improvement made within the spirit and principle of the present disclosure should be included in the protection scope of the present disclosure.

The invention claimed is:

1. An afferent neuron circuit, comprising a resistance (Rc) and a volatile threshold switching device (TS);
   wherein the volatile threshold switching device (TS) has a parasitic capacitor (Cparasitic);
   a first end of the resistance (Rc) serves as a signal input terminal, and a second end of the resistance (Rc) serves as a signal output terminal;
   a first end of the volatile threshold switching device (TS) is connected to the signal output terminal, and a second end of the volatile threshold switching device (TS) is grounded,
   wherein the afferent neuron circuit has an integrated semiconductor structure,
   wherein the volatile threshold switching device (TS) comprises:
      a first substrate;
      a first isolation layer formed on the first substrate;
      a first lower electrode formed on the first isolation layer;
      a second isolation layer formed on the first lower electrode;
      a first functional layer formed on the second isolation layer wherein a middle part of the first functional layer is connected to the first lower electrode through an etched via hole; and
      a first intermediate electrode formed on the first functional layer;
   wherein a first resistive film is deposited on the first intermediate electrode to serve as the resistance (Rc), and a first upper electrode is deposited on the first resistive film.

2. The afferent neuron circuit according to claim 1, wherein,
   the first substrate is a silicon wafer;
   the first isolation layer is a SiO2 layer;
   a material of the first lower electrode is TiN, Poly-Si, Pd, Pt, W, or Au;
   the second isolation layer is a SiO2 layer;
   a material of the first functional layer is NbO2, VO2, SiTe, SiO2:Ag, a-Si:Cu, a-Si:Ag, or AM4Q8;
   a material of the first intermediate electrode is TiN, Poly-Si, Pd, Pt, W, Cu, Ag or Au;
   a resistance value of the first resistive film is greater than 5 times of a resistance value of the first functional layer in a low-resistance state and is less than ⅕ of a resistance value of the first functional layer in a high-resistance state;
   wherein the AM4Q8 is a mixed material of Ga, Ge, V, Nb, Ta, Mo, S, and Se.

3. A mechanoreceptive system, comprising: the afferent neuron circuit according to claim 1;
   a first piezoelectric film formed on the first upper electrode of the afferent neuron circuit; and
   a first ground electrode deposited on the first piezoelectric film.

4. The mechanoreceptive system according to claim 3, wherein a material of the first piezoelectric film is BaTiO3/bacterial cellulose, K0.5Na0.5NbO3-BaTiO3/polyvinylidene fluoride, crystal, lithium gallate, lithium germanate, titanium germanate, or lithium tantalite.

5. An afferent neuron circuit, comprising a resistance (Rc) and a volatile threshold switching device (TS);
   wherein the volatile threshold switching device (TS) has a parasitic capacitor (Cparasitic);
   a first end of the resistance (Rc) serves as a signal input terminal, and a second end of the resistance (Rc) serves as a signal output terminal;
   a first end of the volatile threshold switching device (TS) is connected to the signal output terminal, and a second end of the volatile threshold switching device (TS) is grounded,
   wherein the afferent neuron circuit has an integrated semiconductor structure,
   wherein the volatile threshold switching device (TS) comprises:
      a first substrate;
      a first isolation layer formed on the first substrate;
      a first lower electrode formed on the first isolation layer;
      a second isolation layer formed on the first lower electrode;
      a first functional layer formed on the second isolation layer wherein a middle part of the first functional layer is connected to the first lower electrode through an etched via hole; and
      a first intermediate electrode formed on the first functional layer.

6. The afferent neuron circuit according to claim 5, wherein
   the second substrate is a silicon wafer;
   the third isolation layer is a SiO2 layer;
   a material of the second lower electrode is TiN, Poly-Si, Pd, Pt, W, or Au;
   a material of the second functional layer is NbO2, VO2, SiTe, SiO2:Ag, a-Si:Cu, a-Si:Ag, or AM4Q8;
   a material of the second intermediate electrode is TiN, Poly-Si, Pd, Pt, W, Cu, Ag or Au;
   a resistance value of the second resistive film is greater than 5 times of a resistance value of the second functional layer in a low-resistance state and is less than ⅕ of a resistance value of the first functional layer in a high-resistance state;
   wherein the AM4Q8 is a mixed material of Ga, Ge, V, Nb, Ta, Mo, S, and Se.

7. A mechanoreceptive system, comprising: the afferent neuron circuit according to claim 5;

a second piezoelectric film formed on the second upper electrode of the afferent neuron circuit; and a second ground electrode deposited on the second piezoelectric film.

8. The mechanoreceptive system according to claim 7, wherein a material of the second piezoelectric film is BaTiO3/bacterial cellulose, K0.5Na0.5NbO3-BaTiO3/polyvinylidene fluoride, crystal, lithium gallate, lithium germanate, titanium germanate, or lithium tantalate.

* * * * *